US006176008B1

(12) United States Patent
Ueoka

(10) Patent No.: US 6,176,008 B1
(45) Date of Patent: Jan. 23, 2001

(54) JIG FOR MOUNTING FINE METAL BALLS

(75) Inventor: Yoshito Ueoka, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/219,525

(22) Filed: Dec. 23, 1998

(30) Foreign Application Priority Data

Dec. 24, 1997 (JP) .................................................. 9-354372

(51) Int. Cl.$^7$ ...................................................... H05K 3/30

(52) U.S. Cl. ................................. 29/743; 29/832; 29/833; 29/840; 29/843; 29/854; 29/DIG. 44; 228/180.22; 228/212; 269/21; 269/903

(58) Field of Search ................................. 228/248.1, 253, 228/254, 212, 180.22; 269/21, 903; 29/840, 843, 844, 743, DIG. 44, 746, 876, 879, 833, 832, 854

(56) References Cited

FOREIGN PATENT DOCUMENTS

| 2-278831 | 11/1990 | (JP) . |
| 5-299424 | * 11/1993 | (JP) . |
| 8-167611 | 6/1996 | (JP) . |
| 9-298356 | * 11/1997 | (JP) . |
| 11-97486 | 4/1999 | (JP) . |

* cited by examiner

Primary Examiner—Lee Young
Assistant Examiner—Rick Kiltae Chang
(74) Attorney, Agent, or Firm—McGuireWoods LLP

(57) ABSTRACT

A jig for mounting fine metal balls to a semiconductor chip substrate or a circuit board is disclosed. A tray storing the metal balls is accommodated in a frame and constantly biased upward by springs. Head stops are provided on the frame such that when a suction head mates with the tray for sucking the metal balls, the tray stops at a position slightly sunken into the frame. A clearance is formed between the tray and the frame in the horizontal direction in order to absorb errors in dimensional accuracy when the tray and head are positioned by positioning pins.

12 Claims, 10 Drawing Sheets

JIG FOR MOUNTING FINE METAL BALLS

BACKGROUND OF THE INVENTION

The present invention relates to a jig for mounting metal balls, particularly metal balJs smaller than 1 mm, to a semiconductor chip substrate or a circuit board for soldering.

It has been customary to mount metal balls to electrode pads arranged on a substrate and connect an LSI (Large Scale Integrated circuit) or similar semiconductor to the substrate via the metal balls. The metal balls are as small as about 0.6 mm in BGAs (Ball Grid Arrays) currently predominant in the semiconductors art or as small as 0.3 mm to 0.4 mm in CSPs (Chip Size Packages) recently put to practical use. Future metal balls for such applications are expected to have diameters even smaller than 0.15 mm.

Metal balls to be mounted to the electrode pads of a substrate are usually implemented by solder balls. Japanese Patent Laid-Open Publication No. 5-299424, for example, discloses a method of mounting solder balls to electrode pads formed on a semiconductor substrate. However, the method taught in this document has a problem that a guide plate, or transfer mask, formed with holes for receiving metal balls cannot be reduced in thickness. Further, when the dimensional accuracy of the contour of a container storing metal balls and the contour of a suction head is low, the balls cannot be accurately mounted to the electrode pads. In addition, the guide plate is not replaceable.

Technologies relating to the present invention are also disclosed in, e.g., Japanese Patent Laid-Open Publication No. 8-167611.

SUMMARY OF THE INVENTION

It is therefore an object of the present invention to provide a jig implementing a thin configuration of a guide plate formed with holes for receiving metal balls.

It is another object of the present invention to provide a jig capable of accurately mounting metal balls to electrode pads even when the dimensional accuracy of the contour of a container storing the balls and that of a suction head is low.

It is a further object of the present invention to provide a jig allowing a guide plate thereof to be replaced.

In accordance with the present invention, a jig for mounting metal balls to electrode pads formed on a substrate includes a tray having an open top and storing the metal balls therein. A first mask is positioned on the open top of the tray and formed with a plurality of holes each being sized to pass one of the metal balls therethrough. A frame accommodates the tray and is spaced from the tray by a clearance in the horizontal direction. Resilient members constantly bias the tray toward the first mask away from the bottom of the frame. A suction head faces the first mask and includes a second mask formed with holes facing the holes of the first mask and each having an inside diameter smaller than the diameter of the balls. Distance regulating members regulate the distance between the frame and the suction head such that when the first and second masks contact each other, the tray sinks into the frame against the action of the resilient members.

Also, in accordance with the present invention, a jig for mounting metal balls to electrode pads formed on a substrate includes the tray having an open top for storing the metal balls therein. A transfer mask is positioned on the open top of the tray and is formed with a plurality of holes each being sized to pass one of the metal balls therethrough. A frame accommodates the tray and is spaced from the tray by a clearance in the horizontal direction. Resilient members constantly bias the tray toward the transfer mask away from the bottom of the frame. A regulating device regulates the amount by which the resilient members bias the tray toward the transfer mask. A suction head faces the transfer mask and includes a suction mask formed with holes facing the holes of the transfer mask and each having an inside diameter smaller than the diameter of the balls. Distance regulating members are provided on either one of the surface of the frame and the surface of the suction head facing each other for regulating the distance between the frame and the suction head such that when the transfer mask and suction mask contact each other, the tray sinks into the frame against the action of the resilient members.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

To better understand the present invention, brief reference will be made to a conventional method of mounting solder balls to electrode pads formed on a semiconductor device, shown in FIGS. 1–6. The method to be described is taught in Japanese Patent Laid-Open Publication No. 5-299424 mentioned earlier.

Figure 1:
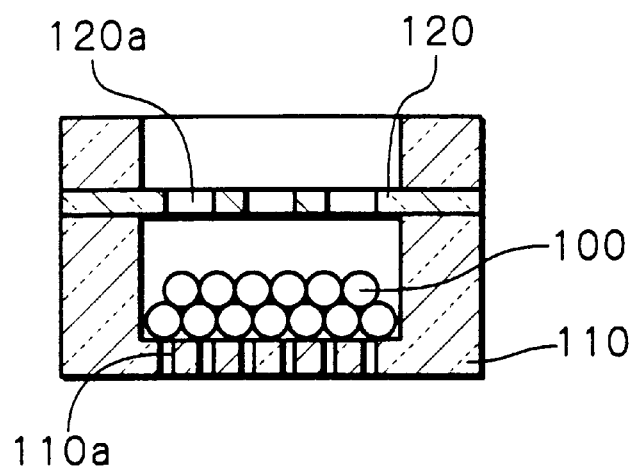
FIG. 1 is a section showing a container storing metal balls and included in a conventional jig.
Figure 2:
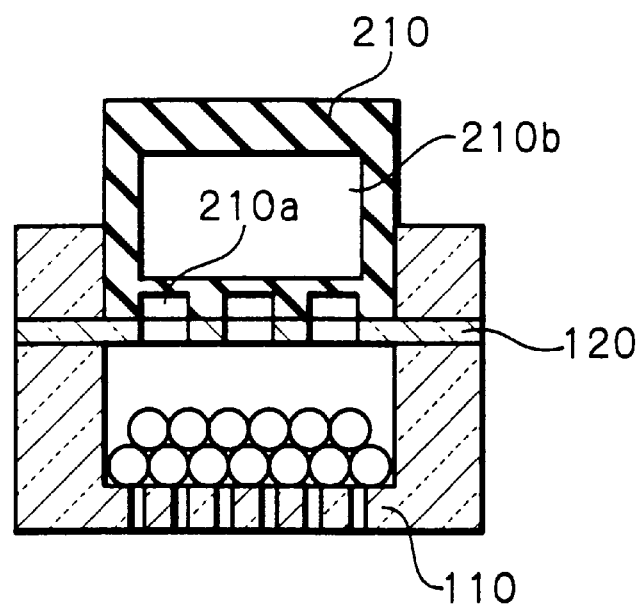
FIGS. 2–6 are sections demonstrating a procedure in which the conventional jig mounts the metal balls to a chip.

As shown in FIG. 1, solder balls 100 are accommodated in a container 110 having a top open, box-like configuration. A plurality of vent holes 110a are formed in the bottom of the container 110, and each has a smaller diameter than one of the solder balls 100. A guide plate 120 is positioned in the intermediate portion of the container 110 in parallel with the bottom of the container 110. The guide plate 120 is formed with through holes 120a each having a diameter large enough to allow one solder ball 100 to pass therethrough. As shown in FIG. 2, a suction head 210 having a hollow box-like configuration is caused to enter the top opening of the container 110. Bores 210a for sucking the solder balls 100 are formed in the bottom of the suction head 210 and aligns with the holes 120a. An exhaust port 210b is formed in a part of one sidewall of the suction head 210 and communicated to a vacuum source not shown.

Figure 3:
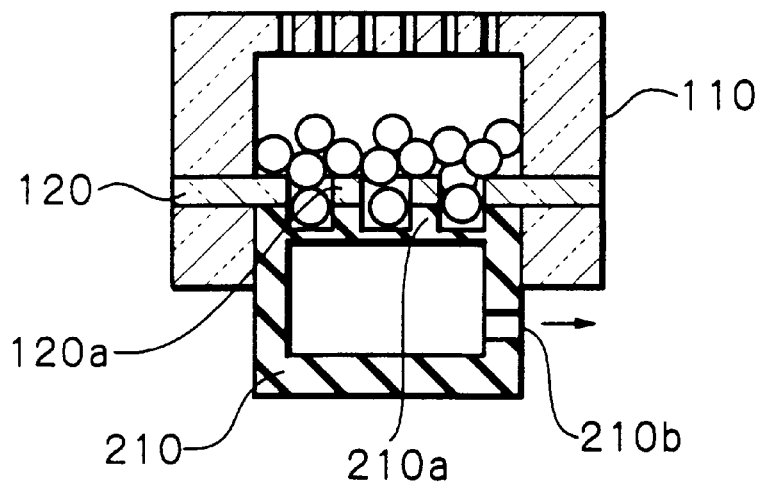

The suction head 210 and container 110 in the position shown in FIG. 2 are turned upside down to a position shown in FIG. 3. As a result, some of the solder balls 100 stored in the container 110 each is received in one of the hole 120a of the guide plate 120 and one of the bores 210a of the head 210 aligning with each other. Then, air is sucked out via the exhaust port 210b in order to suck the solder balls 100 received in the holes 120a and bores 210a.

Figure 4:
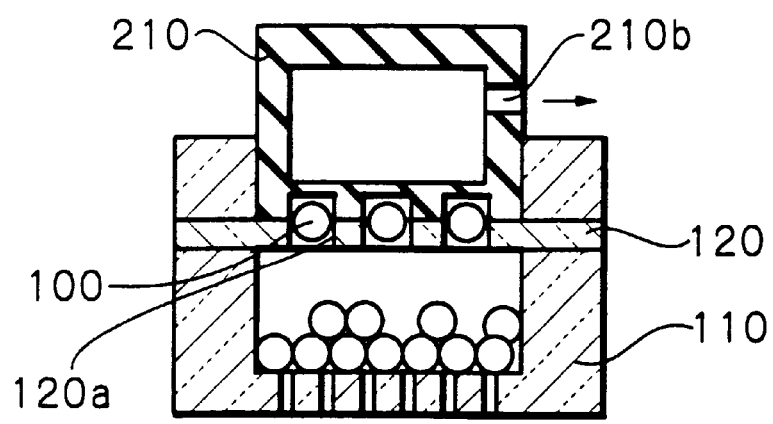

The head 210 and container 110 in the position shown in FIG. 3 are again turned upside down to a position shown in FIG. 4. At this time, the solder balls 100 are sucked onto the guide plate 120 outside of the holes 120a. To cause the solder balls 100 other than the balls 100 received in the holes 120a to drop from the guide plate 120, the head 210 is lifted away from the container 110 with the suction continuously acting on the balls 100.

Figure 5:
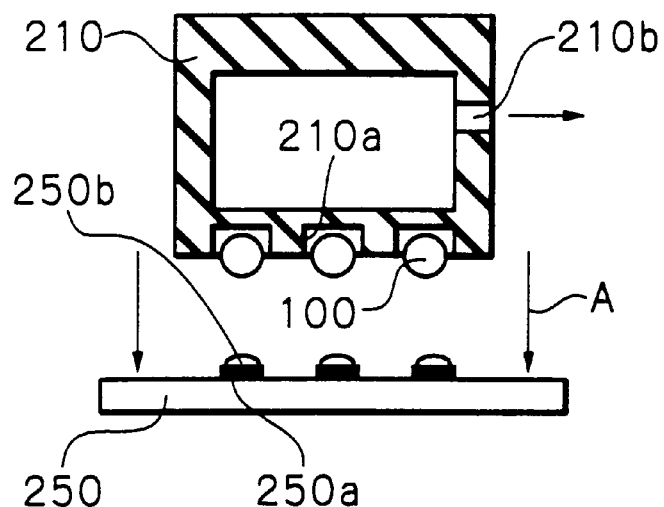
Figure 6:
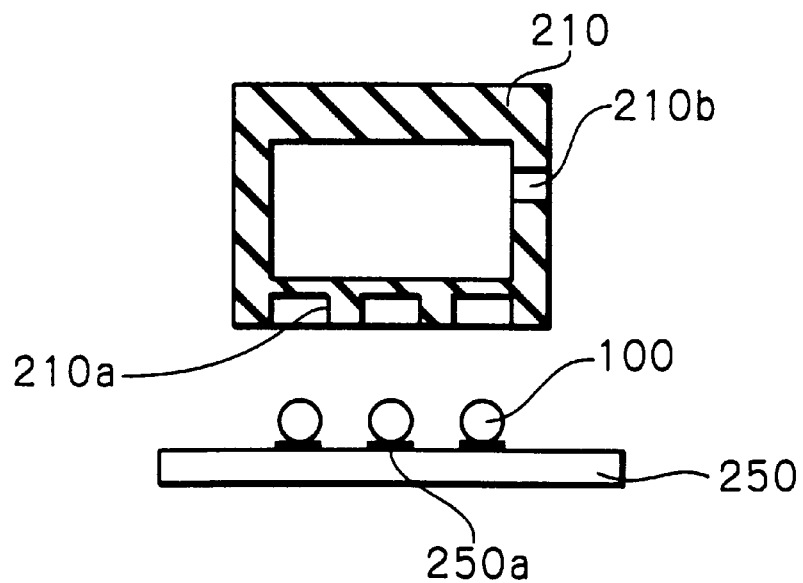

Subsequently, as shown in FIG. 5, the head 210 is shifted to a position above a semiconductor device 250. Then, the head 210 is lowered to mount the solder balls 100 received in the bores 210a on electrode pads 250a. After the suction acting in the head 210 has been canceled, the head 210 is lifted away from the semiconductor device 250, as shown in FIG. 6.

As stated above, the conventional method has the steps of positioning the solder balls 100 in the holes 120a of the guide plate 120 and sucking the balls 110 (FIG. 3), causing the guide plate 120 to select the solder balls 100 being sucked by the head 210, and positioning the balls 100 on the semiconductor device 250.

The above conventional method has some problems left unsolved, as follows. As shown in FIG. 3, when the head 210 is positioned on the guide plate 120, a load acts on the guide plate 120. In addition, during suction effected in the condition shown in FIG. 3, the weight of the container 110 itself acts on the guide plate 120 as a load. Particularly, in the condition shown in FIG. 3, a force ascribable to suction acts from below the guide plate 120. The guide plate 120, therefore, must be thick enough to have sufficient mechanical strength.

However, if the guide plate 120 is thick, then two or more solder balls 100 are apt to enter each hole 120a of the guide plate 120 in the condition shown in FIG. 3. This is particularly true when the solder balls, or metal balls, 100 have a diameter of less than 1 mm. Two or more solder balls 100 entered each hole 120a are passed through the hole 120a due to the suction even if the head 210 is lifted away from the position shown in FIG. 4. This makes it impractical to accurately position one solder ball 100 on each electrode pad 250a, FIGS. 5 and 6.

It follows that the thickness of the guide plate 120 must be smaller than the diameter of the solder balls 100. However, such a thickness cannot bear the various loads to act on the guide plate 120. This problem is more serious when the diameter of the solder balls 100 is less than 0.15 mm. There is an increasing demand for a new technique capable of mounting fine metal balls to a semiconductor device.

Moreover, assume that the contour of the head 210 and that of the container 110 lack in dimensional accuracy. Then, when the head 210 and container 110 face each other, as shown in FIGS. 2–4, the guide plate 120 and the surface of the head 210 where the bores 210a are present do not closely contact each other. As a result, two or more solder balls 100 are apt to enter each hole 120a due to a clearance between the guide plate 120 and the head 210, also resulting in the problem discussed in relation to the thickness of the guide plate 120.

In addition, the guide plate 120 is constructed integrally with the container 110 and cannot be replaced.

Figure 7:
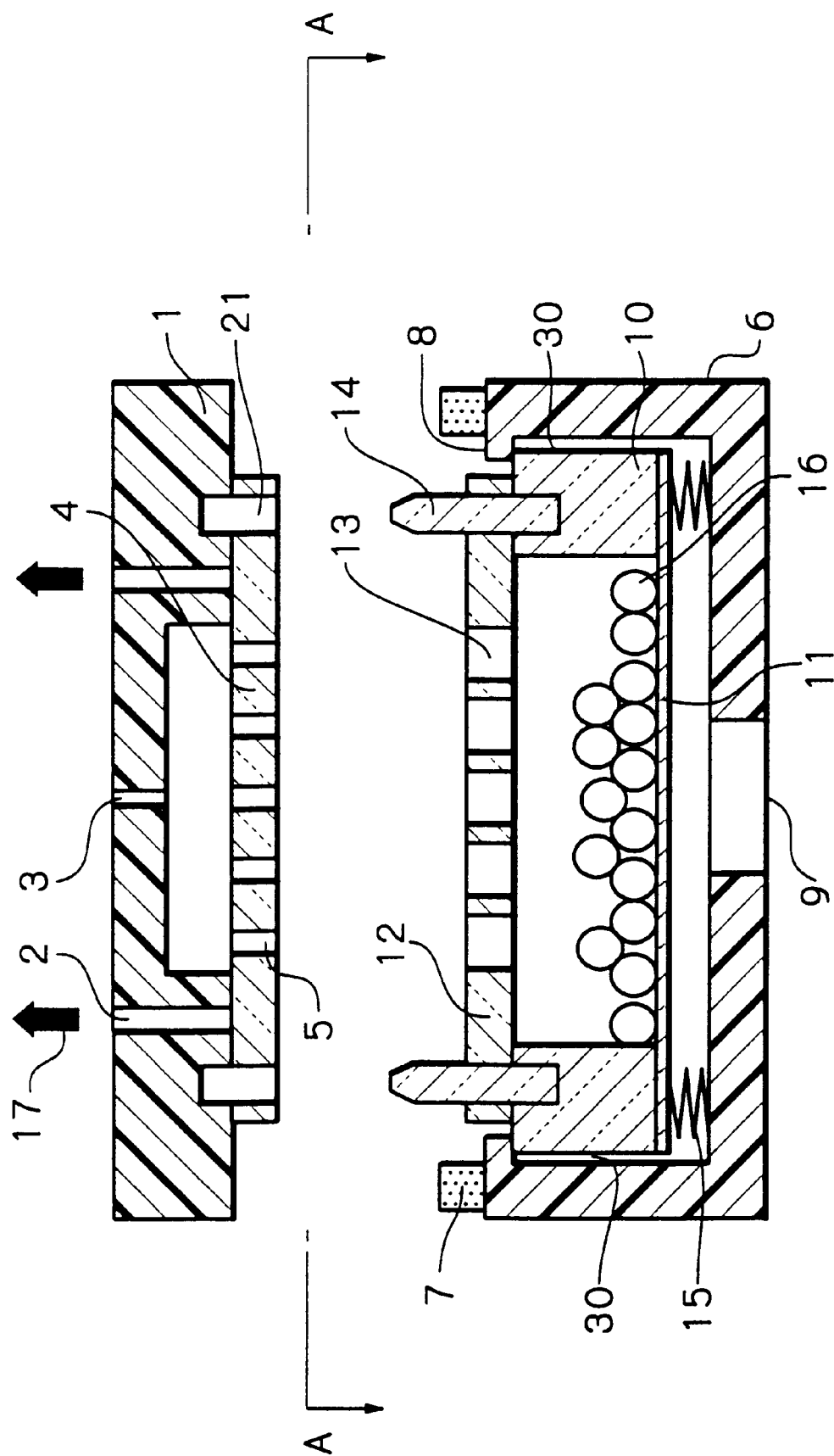
FIG. 7 is a section showing a jig embodying the present invention.
Figure 8:
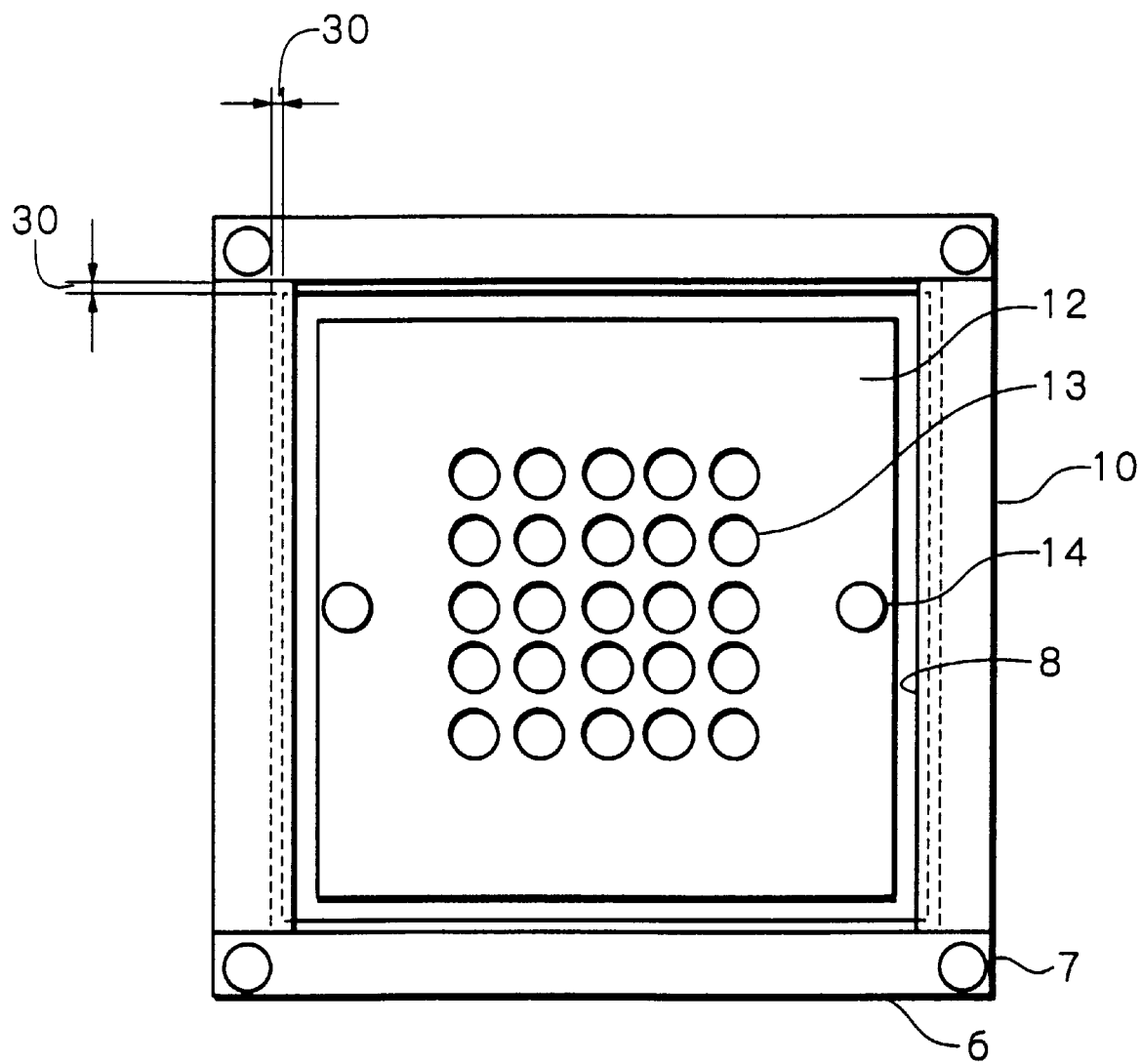
FIG. 8 is a plan view as seen in a direction AA of FIG. 7.

Referring to FIGS. 7 and 8, a jig embodying the present invention will be described. The jig is used to mount solder balls or similar fine metal balls to electrode pads formed on a substrate. As shown in FIG. 7, the jig includes a suction head 1, a box-like frame 6, and a tray 10 disposed in the frame 6 and storing metal balls 16 therein. The metal balls 16 may be formed of solder, gold, copper or a combination thereof applicable to the mounting of LSI chips.

A suction mask (second mask) 4 is positioned on the surface of the head 1 facing the tray 10 by being sucked via mask suction holes 2 formed in the head 1, as indicated by arrows 17 in FIG. 7. Holes 5 smaller in diameter than the metal balls 10 are formed in the suction mask 4 in a desired pattern corresponding to an electrode pattern formed on a substrate not shown. The holes or air passageways 5 merge into a single vacuum hole 3 positioned above the holes 5. The vacuum hole 3 may be replaced with two or more vacuum holes, if desired. The head 1 is configured such that when the metal balls 16 are sucked onto the lower ends of the holes 5 by vacuum introduced into the head 1 via the vacuum hole 3, the head 1 is air-tightly sealed.

While the suction mask 4 shown in FIG. 7 is fixed in place on the head 1 by vacuum, it may be retained on the head 1 by any other suitable scheme. In any case, the suction mask 4 should preferably be positioned on the head 1 in a replaceable manner.

The head 1 is formed of stainless steel, nickel or similar metal, glass or similar inorganic material, or resin. A method of forming the holes 5 depends on the material constituting the head 1. Specifically, machining, etching or electroforming is applicable to metal, etching is applicable to glass, and machining or molding is applicable to resin.

In the illustrative embodiment, the suction head 1 is formed of conductive nickel so as to protect an LSI chip from electrostatic damage. Electroforming is used to form the holes 5 of the suction mask 4. Electroforming not only provides the holes 5 with a diameter with an accuracy of ±2 $\mu$m or less, but also maintains the metal balls 16 at the same height at the time of suction and thereby facilitates mounting of the balls 16. Because thickness that can be dealt with by electroforming is up to about 0.2 mm, three or four films should preferably be laminated in order provide the mask 4 with strength.

Positioning holes 21 are contiguously formed in the portions of the head 1 and suction mask 4 joining each other. Positioning pins 14 are inserted into the positioning holes 21, as will be described specifically later.

The tray 10 storing the metal balls 16 is supported on the bottom of the frame 6 via springs or biasing means 15. The springs 15 constantly bias the tray 10 upward. The bottom of the tray 10 is implemented by a mesh 11, so that air admitted into the tray 10 via an air inlet port 9 can flow into the tray 10.

The frame 6 has, in addition to the air inlet port 9, tray stops 8 for preventing the tray 10 from jumping upward out of the frame 6, and head stops 7 for maintaining a clearance between the frame 6 and the head 1. As shown in FIG. 8, the head stops 7 are affixed to the four corners of the top of the frame 6. The head stops 7 should preferably have a height smaller than the total thickness of the suction mask 4 and a transfer mask (first mask) 12. In this configuration, when the head 1 mates with the tray 10, the head 1 presses the tray 10 downward against the action of the springs 15 and thereby insures close contact between the suction mask 4 and the transfer mask 12.

The tray 10 is affixed to the frame 6 via the springs 15 while being spaced from the inner periphery of the frame 6 by a clearance 30. When the tray 10 is connected to the head 1, the clearance 30 allows the tray 10 to move in the horizontal direction. Specifically, the clearance 30 is selected to be, but not limited to, 0.1 mm.

The positioning pins 14 mentioned earlier are tapered and studded on the top of the tray 10. The positioning holes 21 of the transfer mask 12 respectively mate with the positioning pins 14, as will be described specifically later.

As shown in FIG. 8, the positioning pins 14 are positioned symmetrically to each other in the right-and-left direction. Holes 13 are formed in the transfer mask 12 in the same pattern as the holes 5 of the suction mask 4 and larger in diameter than the metal balls 16. For example, assume that the metal balls 16 have a diameter of 150 μm (0.15 mm), and that the holes 5 have a pitch of 250 μm. Then, each hole 5 has a diameter of 50 μm to 130 μm while each hole 13 has a diameter of 160 μm to 220 μm capable of receiving a single metal ball 16. Should the diameter of the holes 13 be larger than 220 μm, the strength of the transfer mask 12 would be short. Each hole 13 has a depth selected such that the metal ball 16 sucked via the hole 5 aligning with the hole 13 is hidden in the hole 13. It follows that the thickness of the transfer mask 12 is controlled in accordance with the diameter of the metal balls 16 and the depth of the holes 5 which the balls 16 reach.

Figure 15:
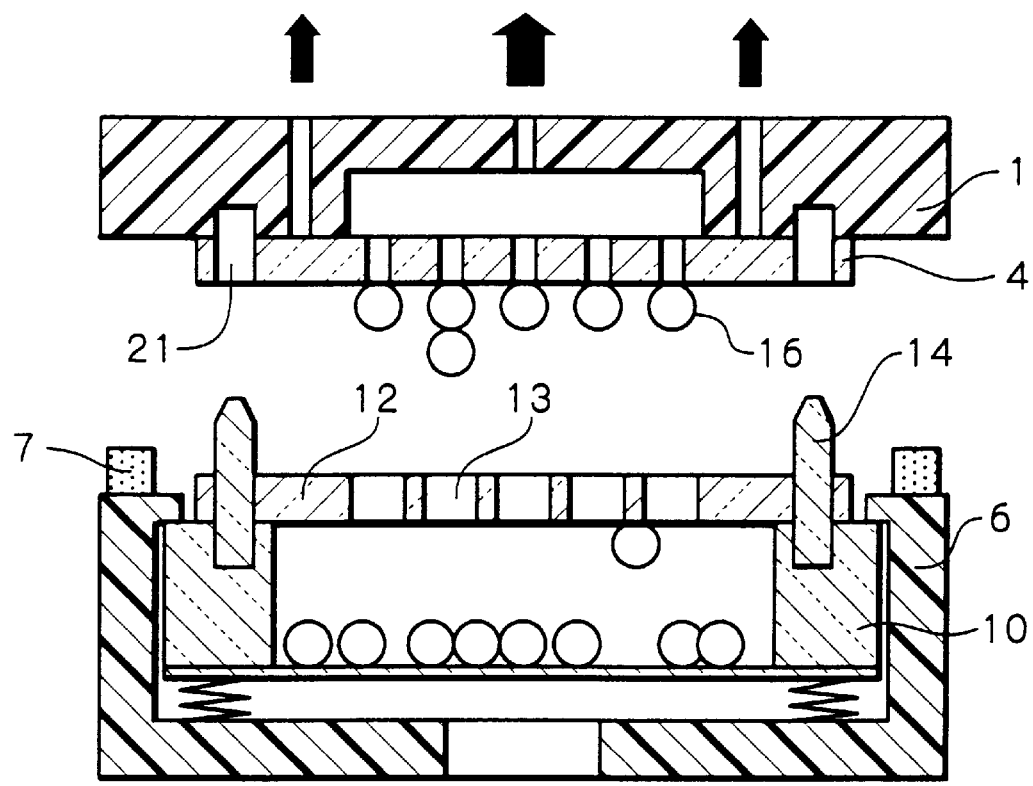
Figure 16:
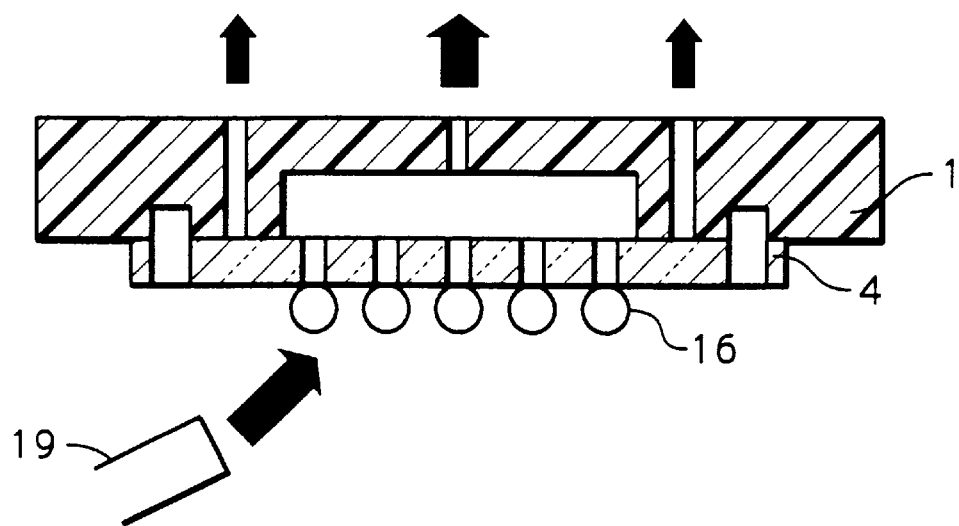
Figure 17:
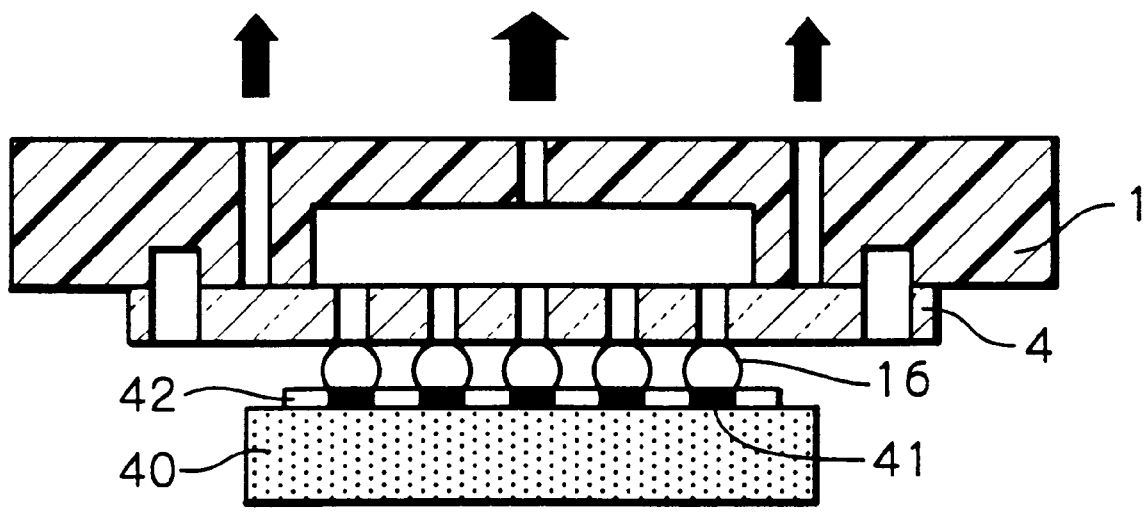
Figure 18:
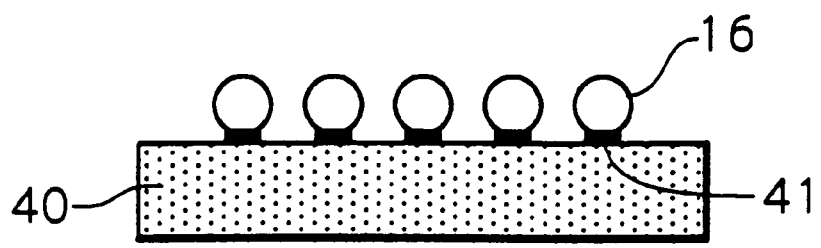

Reference will be made to FIGS. 7–18 for describing how the metal balls 16 are sucked and then mounted to a chip 40 (see FIGS. 17 and 18). As shown in FIG. 7, the head 1 and frame 6 wait for the start of a mounting operation with the holes 5 of the suction mask 4 and the holes 13 of the transfer mask 12 aligning with each other. At this stage, vacuum is not introduced into the suction head 1 via the vacuum hole 3.

Figure 9:
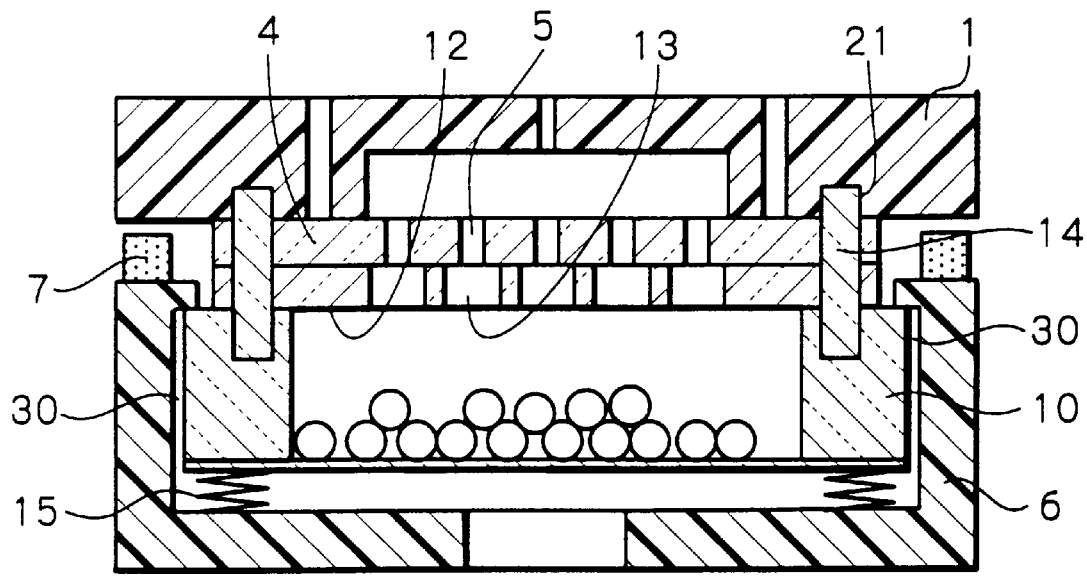
FIGS. 9–18 are sections showing a procedure in which the illustrative embodiment mounts metal balls to a chip.

As shown in FIG. 9, the positioning pins 14 of the tray 10 are respectively inserted into the contiguous positioning holes 21 of the head 1 and suction mask 4. Even when the center of each positioning pin 14 and the center of the associated positioning hole 21 do not accurately align with each other due to the inaccurate positioning of the head 1 and tray 10 at the stage of FIG. 7, the clearance 30 allows the tray 10 to move in the horizontal direction. The pin 14 and hole 21 can therefore smoothly mate with each other. In addition, the clearance 30 successfully absorbs errors in the dimensional accuracy of the contour of the tray 10 and that of the frame 6. On the other hand, with the positioning pins 14, it is possible to increase the positional accuracy between the holes 5 and 13 to less than 20 μm.

Figure 10:
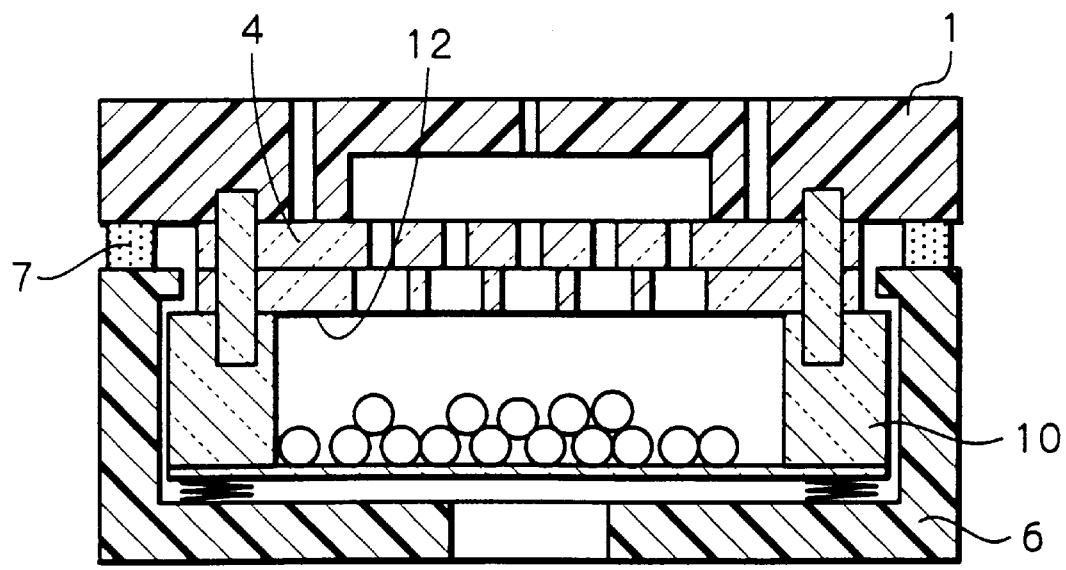

As the pins 14 are inserted deeper into the holes 21, the head 1 abuts against the head stops 7 and compresses the springs 15, as shown in FIG. 10. In this condition, the surface of the suction mask 4 and the surface of the transfer mask 12 are held in close contact with each other and uniformly pressed against each other by the springs 15. This obviates a clearance otherwise occurring between the two masks 4 and 12.

Figure 11:
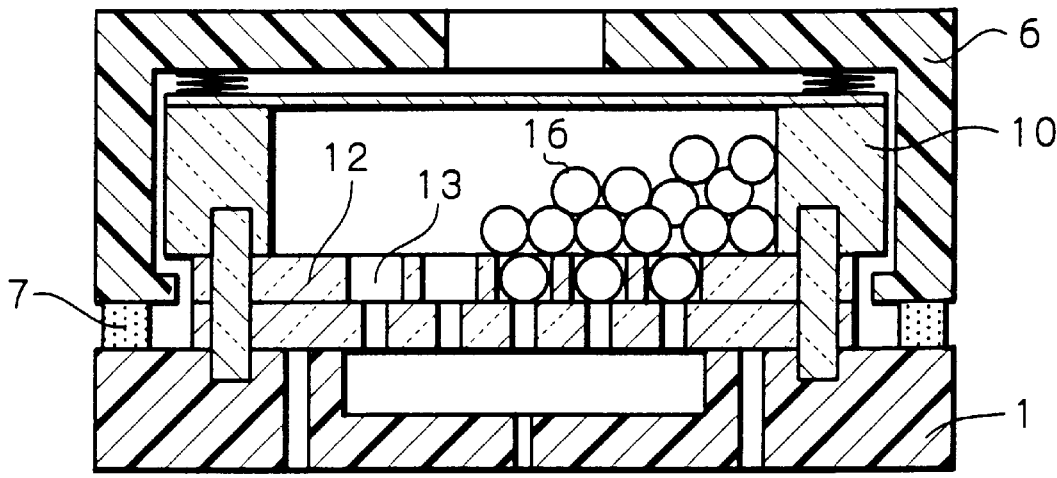

As shown in FIG. 11, the head 1, tray 10 and frame 6 held in the position shown in FIG. 10 are turned upside down by 180 degrees. At this instant, some of the metal balls 16 drop into some of the holes 13 of the transfer mask 12, as illustrated.

Figure 12:
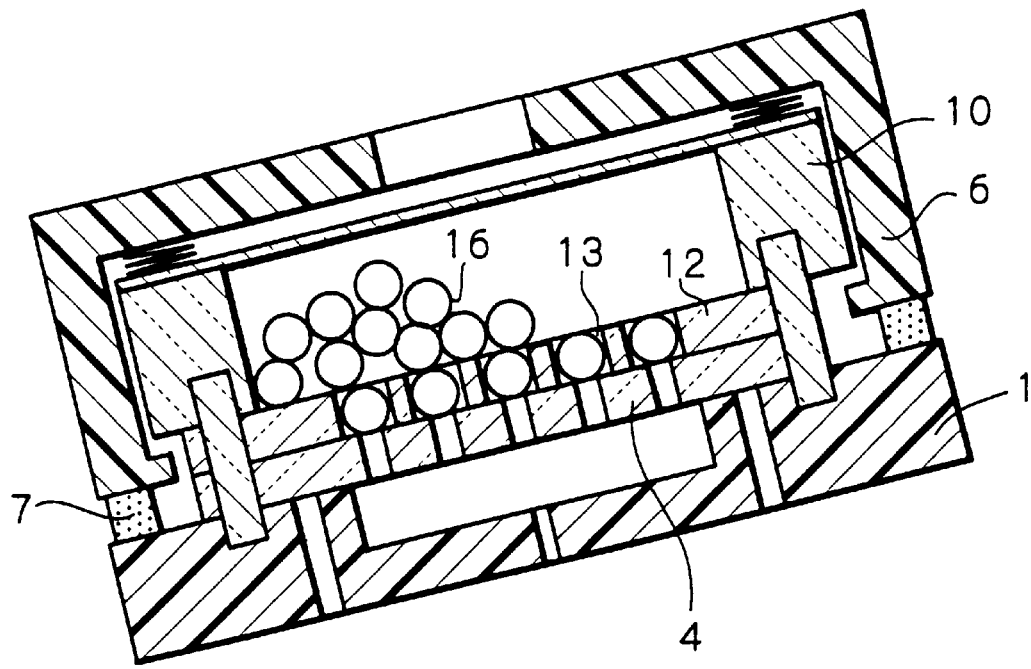

As shown in FIG. 12, the head 1, tray 10 and frame 6 are angularly moved twice to ten consecutive times in a reciprocating motion in order to drop the metal balls 16 in the empty holes 13. The angle, however, should not exceed one preventing the balls 16 once received in the holes from jumping out of the holes 13. The above angular movement may be replaced with or combined with, e.g., ultrasonic oscillation. Even at this stage, vacuum is not introduced into the head 1 via the vacuum hole 3. This, coupled with the fact that each hole 13 is sized to receive a single metal ball 16, prevents two or more metal balls 16 from entering the hole 13 at the same time. That is, a single metal ball 16 can be surely received in a single hole 13.

Figure 13:
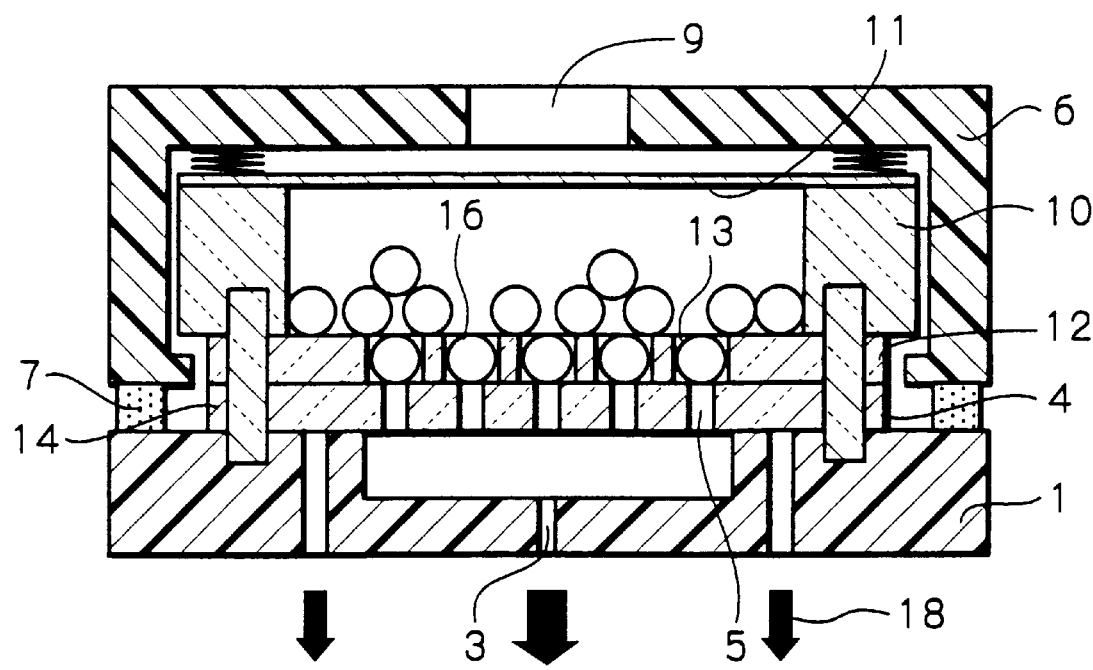

As shown in FIG. 13, vacuum is introduced into the head 1 via the vacuum hole 3 in order to suck out air in a direction indicated by an arrow. As a result, the metal balls 16 received in the holes 13 are sucked onto the edges of the holes 5. Specifically, air is introduced into the tray 10 via the air inlet port 9 and the mesh 11 forming the bottom of the tray 10, causing the metal balls 16 to be sucked onto the edges of the holes 5.

Figure 14:
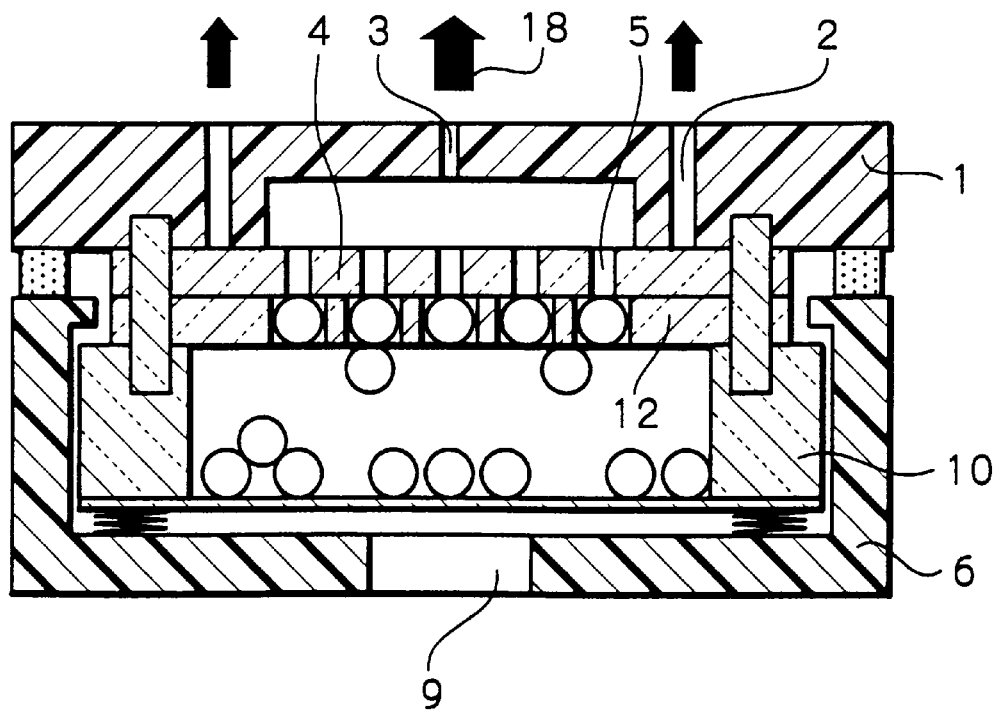

Subsequently, as shown in FIG. 14, the head 1, tray 10 and frame 6 are again turned up side down by 180 degrees with the metal balls 16 being continuously sucked. At this instant, most of the metal balls 16 drop onto the bottom of the tray 10, but some of them still remain on the rear of the mask 12 due to static electricity or contamination, as illustrated.

As shown in FIG. 15, the head 1 is lifted away from the tray 10 while retaining the metal balls 16 on the suction mask 4 by suction. No excessive metal balls 16 are expected to remain on the suction mask 4 because each hole 13 of the transfer mask 12 is sized to receive only one metal ball 16, as stated earlier. FIG. 16 shows a step to be executed when two or more metal balls 16 are entrained by any one of the holes 5 of the suction mask 4 due to static electricity or contamination. As shown, air is blown from a nozzle 19 toward the metal balls 16 retained on the suction mask 4, thereby causing excessive metal balls 16 to drop. The nozzle 19 may be moved along the suction mask 4, if desired.

As shown in FIG. 17, flux 42 is applied to the chip 40 beforehand. The head 1 retaining the metal balls 16 on the suction mask 4 is brought to a position above the chip 40. After the metal balls 16 have been aligned with electrodes 41 arranged on the chip 40, the balls 16 are mounted to the electrodes 41. At the same time, the supply of vacuum to the head 1 is interrupted. Consequently, the metal balls 16 are affixed to the electrodes 41, as shown in FIG. 18.

In summary, it will be seen that the illustrative embodiment shown and described achieves various unprecedented advantages, as enumerated below.

(1) The head stops 7 provided on the frame 6 maintain a preselected distance between the frame 6 and tray 10 and the suction head 1. This, coupled with the fact that the transfer mask 12 is free from excessive loads otherwise acting from the suction mask 1 side, allows the thickness of the mask 12 to be reduced.

(2) The springs 15 constantly bias the tray 10 away from the bottom of the frame 6. In this condition, the suction mask 4 and transfer mask 12 closely contact each other without any clearance. In addition, the springs 15 absorb a shock to occur when the positioning pins 14 are inserted into the positioning holes 21. This further promotes the thin configuration of the transfer mask 12.

(3) The positioning pins 14 are affixed to the tray 10, and the clearance 30 exists between the tray 10 and the frame 6. This insures smooth engagement without regard to the dimensional accuracy of the contour of the tray 10 and that of the suction mask 1 or the positional accuracy of the positioning pins 14 and positioning holes 21 before engagement. The positioning pins 14 realize positional accuracy of the holes 5 and 13 which is less than 20 μm.

(4) The transfer mask 12 is supported by the positioning pins 14 and therefore easy to replace.

Various modifications will become possible for those skilled in the art after receiving the teachings of the present disclosure without departing from the scope thereof, as follows:

(1) The springs 15 may be implemented by any suitable resilient members, e.g., coil springs.

(2) The positioning pins 14 and positioning holes 21 have been shown and described as being provided on the tray 10 and suction head 1, respectively. Alternatively, the pins 14 and holes 21 may be provided on the head 1 and tray 10, respectively, in which case the transfer mask 12 will be affixed to the tray 10.

(3) The head stops 7 may, of course, be implemented by the extensions of the side walls of the frame 6 and may even be affixed to the head 1.

(4) While the metal balls 16 are assumed to be tin-lead solder balls, they may be formed of gold, copper, nickel or resin covered with metal.

(5) A plurality of air inlet ports 9 may be formed in the peripheral portion of the frame 6.

(6) The holes 13 formed in the transfer mask 12 may be tapered.

What is claimed is:

1. A jig for mounting metal balls to electrode pads formed on a substrate, comprising;
   a tray having an open top and storing the metal balls therein;
   a first mask positioned on the open top of said tray and formed with a plurality of holes, each of said plurality of holes of said first mask being sized to pass one of the metal balls therethrough;
   a frame for accommodating said tray and being spaced from said tray by a clearance in a horizontal direction;
   biasing means for constantly biasing said tray toward said first mask and away from a bottom of said frame;
   a suction head facing said first mask and including a second mask formed with holes facing said holes of said first mask, each of said holes of said second mask having an inside diameter smaller than a diameter of the metal balls; and
   distance regulating members associated with one of said frame and said suction head for regulating a distance between said frame and said suction head such that when said first mask and said second mask contact each other, said tray sinks into said frame against an action of said biasing means.

2. The jig as claimed in claim 1, further comprising positioning pins studded on said tray for causing, when said first mask and said second mask contact each other, said holes of said first mask and said holes of said second mask to align with each other.

3. The jig as claimed in claim 2, wherein said distance regulating members comprise stops provided on either one of a surface of said frame and a surface of said suction head facing each other.

4. The jig as claimed in claim 2, wherein said positioning pins are passed through said first mask to thereby fix said first mask in place.

5. The jig as claimed in claim 4, wherein said distance regulating members comprise stops provided on either one of a surface of said frame and a surface of said suction head facing each other.

6. The jig as claimed in claim 1, further comprising positioning pins provided on said suction head for causing, when said first mask and said second mask contact each other, said holes of said first mask and said holes of said second mask to align with each other.

7. The jig as claimed in claim 6, wherein said distance regulating members comprise stops provided on either one of a surface of said frame and a surface of said suction head facing each other.

8. The jig as claimed in claim 1, further comprising means for blowing air toward the metal balls retained on said suction head by suction.

9. The jig as claimed in claim 1, wherein said distance regulating members comprise stops provided on either one of a surface of said frame and a surface of said suction head facing each other.

10. A jig for mounting metal balls to electrode pads formed on a substrate, comprising;
    a tray having an open top and storing the metal balls therein;
    a transfer mask positioned on the open top of said tray and formed with a plurality of holes, each of said plurality of holes of said transfer mask being sized to pass one of the metal balls therethrough;
    a frame accommodating said tray and spaced from a clearance in a horizontal direction;
    biasing means for constantly biasing said tray toward said transfer mask and away from a bottom of said frame;
    regulating means for regulating an amount by which said biasing means biases said tray toward said transfer mask;
    a suction head facing said transfer mask and including a suction mask formed with holes facing said holes of said transfer mask, each of said holes of said second mask having an inside diameter smaller than a diameter of the metal balls;
    distance regulating members provided on either one of a surface of said frame and a surface of said suction head facing each other for regulating a distance between said frame and said suction head such that when said transfer mask and said suction mask contact each other, said tray sinks into said frame against an action of said biasing means.

11. The jig for mounting metal balls to electrode pads formed on a substrate, comprising;
    a tray having an open top;
    a transfer mask positioned on the open top of said tray and formed with a plurality of holes having a diameter larger than a diameter of said metal balls;
    a frame, the tray fitting within the frame and spaced from the frame in a horizontal direction;
    springs positioned between a bottom surface of said tray and the frame, the springs constantly biasing said tray toward said transfer mask and away from a bottom of said frame;
    tray stops located on said frame, said tray stops preventing said tray from leaving the frame due to the biasing of said springs;
    a suction head facing said transfer mask and including a suction mask formed with holes facing the holes of said transfer mask, said holes of said second mask having an inside diameter smaller than a diameter of the metal balls and smaller than the diameter of the holes of said transfer mask;
    aligning means locating on the suction head and the transfer mask for aligning the holes of said suction mask and the holes of said transfer mask.

12. The jig as claimed in claim 11, wherein the tray includes a mesh bottom.

* * * * *